US009997547B2

(12) United States Patent
Zuo et al.

(10) Patent No.: US 9,997,547 B2
(45) Date of Patent: Jun. 12, 2018

(54) CARRIER SUBSTRATE HAVING A PLURALITY OF FLUID PASSAGES AND METHOD OF FABRICATING DISPLAY APPARATUS UTILIZING THE SAME

(71) Applicant: BOE TECHNOLOGY GROUP CO., LTD., Beijing (CN)

(72) Inventors: Yueping Zuo, Beijing (CN); Chien Hung Liu, Beijing (CN); Liangjian Li, Beijing (CN); Yinghai Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 128 days.

(21) Appl. No.: 15/107,070

(22) PCT Filed: Feb. 22, 2016

(86) PCT No.: PCT/CN2016/074265
§ 371 (c)(1),
(2) Date: Jun. 21, 2016

(87) PCT Pub. No.: WO2016/192418
PCT Pub. Date: Dec. 8, 2016

(65) Prior Publication Data
US 2017/0141135 A1 May 18, 2017

(30) Foreign Application Priority Data

Jun. 1, 2015 (CN) .......................... 2015 1 0292470

(51) Int. Cl.
*H01L 21/683* (2006.01)
*H01L 27/12* (2006.01)
(52) U.S. Cl.
CPC .............................. *H01L 27/1266* (2013.01)

(58) Field of Classification Search
USPC ...... 156/247, 307.1, 307.3, 307.7, 701, 703; 428/131, 134, 135, 188
See application file for complete search history.

(56) References Cited

U.S. PATENT DOCUMENTS 4,071,944 A * 2/1978 Chuss ............... H01L 21/67132
156/155
7,326,457 B2 * 2/2008 Yokoyama ........... B65G 49/061
156/382

(Continued)

FOREIGN PATENT DOCUMENTS

| CN | 102214749 A | 10/2011 |
| CN | 102651331 A | 8/2012 |

(Continued)

OTHER PUBLICATIONS

The First Office Action in the Chinese Patent Application No. 201510292470.4, dated Jun. 27, 2017; English translation attached.

(Continued)

*Primary Examiner* — Sing P Chan
(74) *Attorney, Agent, or Firm* — Intellectual Valley Law, P.C.

(57) ABSTRACT

The present application discloses a method of fabricating a display apparatus, comprising providing a carrier substrate comprising a base substrate and an adhesive layer over the base substrate, wherein the base substrate comprises a plurality of fluid passages between the base substrate and the adhesive layer, and a plurality of fluid inlets connected with the plurality of fluid passages; forming a product substrate on a side of the adhesive layer distal to the base substrate; dispensing a detaching agent through the plurality of fluid inlets to the plurality of fluid passages, and contacting the detaching agent with the adhesive layer through the plurality of fluid passages; and detaching the product substrate from the carrier substrate.

20 Claims, 9 Drawing Sheets

(56) References Cited

U.S. PATENT DOCUMENTS

2004/0048447 A1  3/2004  Kondo
2012/0300419 A1  11/2012 Tang et al.
2012/0318771 A1  12/2012 Guo et al.

FOREIGN PATENT DOCUMENTS

CN  102956668 A   3/2013
CN  103682176 A   3/2014
CN  104979284 A   10/2015

OTHER PUBLICATIONS

International Search Report & Written Opinion dated May 5, 2016 regarding PCT/CN2016/074265.

* cited by examiner

CARRIER SUBSTRATE HAVING A PLURALITY OF FLUID PASSAGES AND METHOD OF FABRICATING DISPLAY APPARATUS UTILIZING THE SAME

CROSS-REFERENCE TO RELATED APPLICATION

This application claims priority to Chinese Patent Application No. 201510292470.4, filed Jun. 1, 2015, the contents of which are incorporated by reference in the entirety.

TECHNICAL FIELD

The present invention relates to display technology, more particularly, to a carrier substrate having a plurality of fluid passages, and a method of fabricating a display apparatus utilizing the same.

BACKGROUND

Ultrathin display device may be manufactured by thinning the glass substrate or utilizing a carrier substrate for supporting an ultrathin array substrate. The former typically involves complex and costly procedures of grinding and polishing the glass substrate after the display components are formed on the glass substrate.

The latter typically involves adhering an ultrathin array substrate to a carrier substrate through an adhesive layer. The adhered carrier substrate and ultrathin array substrate are shown in FIG. 1A. The adhesive layer b is formed on the carrier substrate a, and the ultrathin array substrate c is placed on top of the adhesive layer b. Display components are formed on the ultrathin array substrate c, and encapsulated using an encapsulating substrate d (FIG. 1B). The ultrathin array substrate c is then detached from the carrier substrate a.

Typically, the ultrathin array substrate c is detached from the carrier substrate a by contacting a fluorine-containing detaching agent with the adhesive layer b from four sides of the adhesive layer b (FIG. 1C). The fluorine-containing detaching agent reacts with the adhesive layer b material, thereby detaching the ultrathin array substrate c (along with the encapsulating substrate d) from the carrier substrate a (FIG. 1D).

SUMMARY

In one aspect, the present invention provides a method of fabricating a display apparatus, comprising providing a carrier substrate comprising a base substrate and an adhesive layer over the base substrate, wherein the base substrate comprises a plurality of fluid passages between the base substrate and the adhesive layer, and a plurality of fluid inlets connected with the plurality of fluid passages; forming a product substrate on a side of the adhesive layer distal to the base substrate; dispensing a detaching agent through the plurality of fluid inlets to the plurality of fluid passages, and contacting the detaching agent with the adhesive layer through the plurality of fluid passages; and detaching the product substrate from the carrier substrate.

Optionally, the method further comprises forming the carrier substrate.

Optionally, the step of forming the carrier substrate comprises providing the base substrate; and forming the adhesive layer over the base substrate.

Optionally, the step of forming the carrier substrate comprises forming the plurality of fluid passages on the surface of the base substrate.

Optionally, the plurality of fluid inlets are orifices of the plurality of fluid passages.

Optionally, one of the plurality of fluid passages is connected with another one of the plurality of fluid passages.

Optionally, the one of the plurality of fluid passages is a tube, and the another one of the plurality of fluid passages is a channel.

Optionally, any one of the plurality of fluid passages is connected with at least another one fluid passage.

Optionally, the plurality of fluid passages comprise a plurality of tubes.

Optionally, the plurality of tubes are a plurality of nanotubes.

Optionally, the plurality of nanotubes are a plurality of carbon nanotubes.

Optionally, a diameter of the plurality of nanotubes is in the range of about 1 about 50 nm.

Optionally, the plurality of nanotubes are a plurality of zinc oxide nanotubes.

Optionally, a diameter of the plurality of nanotubes is in the range of about 100 nm to about 500 nm.

Optionally, the plurality of fluid passages comprise a plurality of channels.

Optionally, a width of the plurality of channels is no more than about 3 μm, and a depth of the plurality of channels is in the range of about 50 nm to about 500 nm.

Optionally, the plurality of fluid passages comprise a plurality of interconnected tubes and channels, at least one tube connects with at least one channel.

Optionally, the carrier substrate further comprises a plurality of flow outlets connected with the plurality of flow inlets through the plurality of fluid passages.

Optionally, the plurality of flow outlets are orifices of the plurality of fluid passages.

Optionally, the plurality of fluid passages comprise a lattice of walls defining a network of flow channels or tubes.

Optionally, the lattice is a hexagonal lattice.

Optionally, the network comprises a circular flow tube at each intersection of lattice walls.

Optionally, the detaching agent is a gas, and the plurality of fluid passages are a plurality of gas passages.

Optionally, the detaching agent is a liquid, and the plurality of fluid passages are a plurality of liquid passages.

Optionally, the detaching agent is hyrdofluorine.

In another aspect, the present invention provides a carrier substrate comprising a base substrate having a plurality of fluid passages on a surface of the base substrate and a plurality of fluid inlets connected with the plurality of fluid passages.

Optionally, the carrier substrate further comprises an adhesive layer, the plurality of fluid passages on a surface of the base substrate proximal to the adhesive layer.

Optionally, the plurality of fluid passages comprise a plurality of nanotubes.

Optionally, the plurality of fluid passages comprise a plurality of channels.

Optionally, the plurality of fluid passages comprise a plurality of interconnected tubes and channels, at least one tube connects with at least one channel.

Optionally, the plurality of fluid passages comprise a lattice of walls defining a network of flow channels or tubes.

Optionally, the lattice is a hexagonal lattice.

Optionally, the network comprises a circular flow channel or tube at each intersection of lattice walls.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1A:
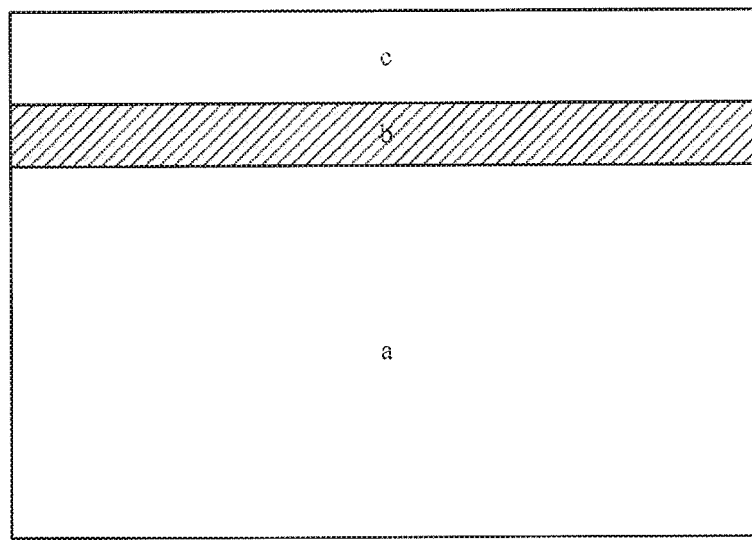
FIG. 1A is a diagram illustrating the structure of an array substrate adhered to a conventional carrier substrate through an adhesive layer.
Figure 1B:
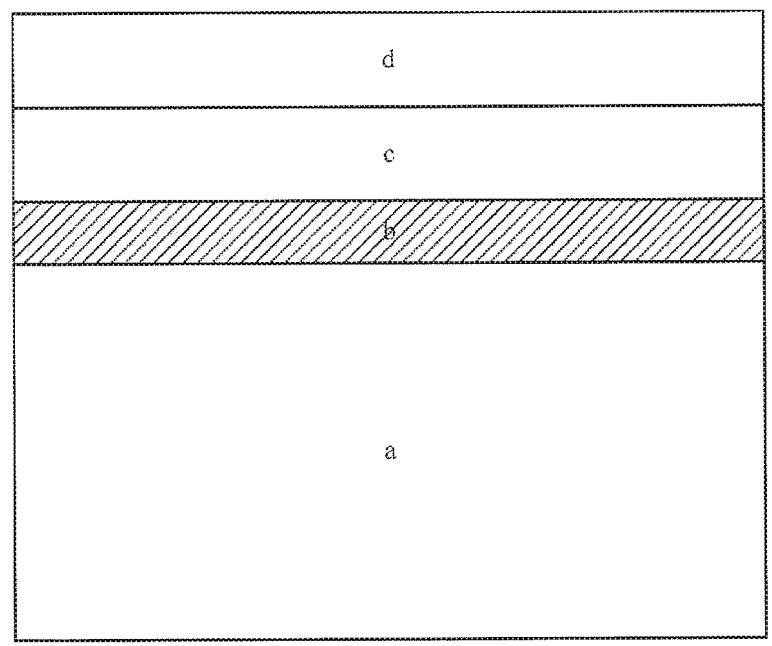
FIG. 1B is a diagram illustrating the structure of an array substrate having display components formed thereon encapsulated by an encapsulating substrate, the array substrate adhered to a conventional carrier substrate through an adhesive layer.
Figure 1C:
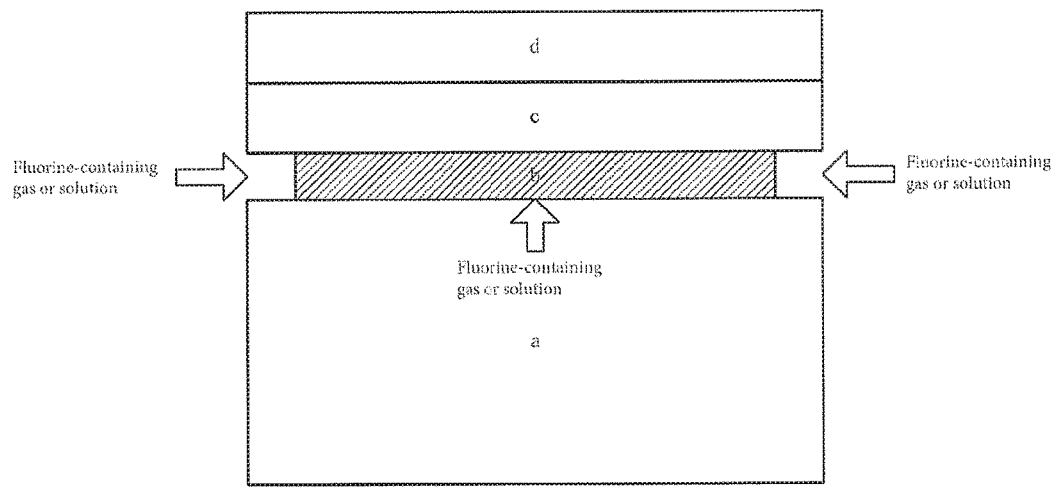
FIG. 1C is a diagram illustrating the process of detaching an array substrate from a conventional carrier substrate using a fluorine-containing detaching agent.
Figure 1D:
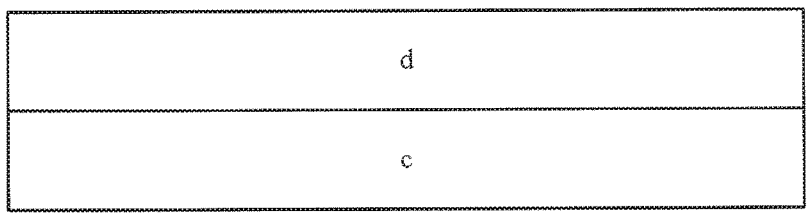
FIG. 1D is a diagram illustrating the structure of a display apparatus having an array substrate and an encapsulating substrate detached from a conventional carrier substrate.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In a conventional method of fabricating an ultrathin display device (e.g., as shown in FIGS. 1A-1D), the carrier substrate and the ultrathin array substrate anneal together. Due to the high temperature applied during the formation of display components on the array substrate, the carrier substrate and the ultrathin array substrate covalently bind to each other (e.g., through the adhesive layer). As a result, the detaching agent does not permeate into the space between the carrier substrate and the ultrathin array substrate. The contact surface between the detaching agent and the adhesive layer is quite small, so is the erosion rate of the adhesive layer. The detaching efficiency is low and sometimes the ultrathin array substrate may not completely detach, resulting in a high defect rate of the display product.

In one aspect, the present disclosure provides a superior method of fabricating a display apparatus. In some embodiments, the method includes forming an adhesive layer on a base substrate. The base substrate includes a plurality of fluid passages between the base substrate and the adhesive layer (e.g., on a surface of the base substrate proximal to the adhesive layer) and a fluid inlet connected with the plurality of fluid passages. Optionally, the method further includes forming a product substrate on a side of the adhesive layer distal to the base substrate, dispensing a detaching agent through the fluid inlet to the plurality of fluid passages, contacting the detaching agent with the adhesive layer through the plurality of fluid passages, and/or detaching the product substrate from the carrier substrate.

In some embodiments, the method includes forming a plurality of fluid passages on a surface of a base substrate. Optionally, the method further includes forming a fluid inlet connected with the plurality of fluid passages. Optionally, the method includes forming a plurality of fluid inlets connected with the plurality of fluid passages.

In some embodiments, the method includes forming a plurality of fluid passages on a surface of a base substrate and forming an adhesive layer over the base substrate. The base substrate includes a plurality of fluid passages on a surface of the base substrate proximal to the adhesive layer and a fluid inlet connected with the plurality of fluid passages. Optionally, the method further includes forming a product substrate on a side of the adhesive layer distal to the base substrate, dispensing a detaching agent through the fluid inlet to the plurality of fluid passages, contacting the detaching agent with the adhesive layer through the plurality of fluid passages, and detaching the product substrate from the carrier substrate.

In another aspect, the present disclosure provides a superior carrier substrate for fabricating a display apparatus. In some embodiments, the carrier substrate includes a base substrate having a plurality of fluid passages on a surface of the base substrate and a fluid inlet connected with the plurality of fluid passages. Optionally, the carrier substrate further includes an adhesive layer, and the plurality of fluid passages are on a surface of the base substrate proximal to the adhesive layer.

The fluid passage may have any appropriate shape and/or dimension, and may be made of any appropriate method. For example, the fluid passage may be a tube or a channel, or a combination of tubes and channels. The fluid passage may be formed by deposition or by etching. Optionally, the plurality of fluid passages include a plurality of nanotubes, e.g., carbon nanotubes or zinc oxide nanotubes. Optionally, the diameter of the nanotubes is in the range of about 1 nm to about 1000 nm, e.g., about 1 nm to about 10 nm, about 1 nm to about 20 nm, about 1 nm to about 50 nm, about 1 nm to about 100 nm, about 50 nm to about 1000 nm, about 50 nm to about 500 nm, about 100 nm to about 1000 nm, or about 100 nm to about 500 nm. Optionally, the plurality of fluid passages include a plurality of channels. Optionally, the width of the channels is in the range of about 1 nm to about 30 µm, e.g., about 1 nm to about 20 µm, about 1 nm to about 10 µm, about 1 nm to about 5 µm, about 1 nm to about 3 µm, about 1 nm to about 2 µm, about 1 nm to about 1 µm, about 0.1 µm to about 30 µm, about 0.1 µm to about 20 µm, about 0.1 µm to about 10 µm, about 0.1 µm to about 5 µm, about 0.1 µm to about 3 µm, about 0.1 µm to about 1 µm, about 1 µm to about 30 µm, about 1 µm to about 20 µm, about 1 µm to about 10 µm, or about 1 µm to about 3 µm. Optionally, the depth of the channels is in the range of about 10 nm to about 10 µm, e.g., about 10 nm to about 5 µm, about 10 nm to about 1 µm, about 10 nm to about 500 nm, about 50 nm to about 10 µm, about 50 nm to about 5 µm, about 50 nm to about 1 µm, about 50 nm to about 500 nm, about 100 nm to about 10 µm, about 100 nm to about 5 µm, about 100 nm to about 1 µm, or about 100 nm to about 500 nm. In some embodiments, the plurality of fluid passages include a plurality of interconnected tubes and channels, at least one tube connects with at least one channel. Optionally, the plurality of fluid passages comprise a straight portion and a curved portion. Optionally, the plurality of fluid passages include a porous sponge structure, e.g., a porous graphene sponge.

In some embodiments, one of the plurality of fluid passages is connected with another one of the plurality of fluid passages. Optionally, the plurality of fluid passages includes a plurality of tubes and a plurality of channels, at least one tube is connected with at least one channel. Optionally, the plurality of fluid passages are interconnected. Optionally, any one of the plurality of fluid passages is connected with at least another one fluid passage. Optionally, the plurality of fluid passages comprise a plurality of interconnected tubes and channels, at least one tube connects with at least one channel.

In some embodiments, the carrier substrate includes a fluid inlet connected with the plurality of fluid passages. The inlet can be located in any appropriate place as long as it is accessible for dispensing the detaching agent to the plurality of fluid passages. Optionally, the inlet is located at the interface between the base substrate and the adhesive layer, e.g., on a surface of the base substrate proximal to the adhesive layer. Optionally, the inlet is an orifice of the plurality of fluid passages, e.g., located on a side of the carrier substrate.

In some embodiments, the carrier substrate includes a fluid outlet connected with the plurality of fluid passages. The outlet can be located in any appropriate place. Optionally, the outlet is located at the interface between the base substrate and the adhesive layer, e.g., on a surface of the base substrate proximal to the adhesive layer. Optionally, the outlet is an orifice of the plurality of fluid passages, e.g., located on a side of the carrier substrate.

In some embodiments, the plurality of fluid passages includes a lattice of walls defining a network of flow channels or tubes. Examples of lattices include, but are not limited to, a rhombic lattice, a square lattice, a rectangular lattice, a hexagonal lattice, a triangular lattice, a parallelogrammic lattice, etc. Optionally, the lattice is a hexagonal lattice. Optionally, the network includes a circular flow channel or tube at each intersection of lattice walls. Optionally, the plurality of fluid passages includes a hexagonal lattice of walls defining a network of flow channels, and the network includes a circular flow channel at each intersection of lattice walls.

The detaching agent may be a gas or a liquid. Optionally, the detaching agent is a gas, and the plurality of fluid passages are a plurality of gas passages. Optionally, the detaching agent is a liquid, and the plurality of fluid passages are a plurality of liquid passages. Optionally, the detaching agent includes a fluorine-containing material. Optionally, the detaching agent is a hydrofluorine gas. Optionally, the detaching agent is a hydrofluorine solution.

In some embodiments, the product substrate is an ultrathin substrate. Optionally, the product substrate has a thickness of no more than 1 mm, e.g., no more than 0.5 mm or no more than 0.3 mm. Optionally, the product substrate is a flexible substrate. Optionally, the base substrate is a glass substrate. Optionally, the adhesive layer is made of a material selected from the group consisting of silicon oxynitride ($SiO_xN_y$), silicon oxide ($SiO_x$), and silicon nitride ($SiN_x$). Optionally, the adhesive layer is deposited by plasma-enhanced chemical vapor deposition (PECVD).

Figure 2A:
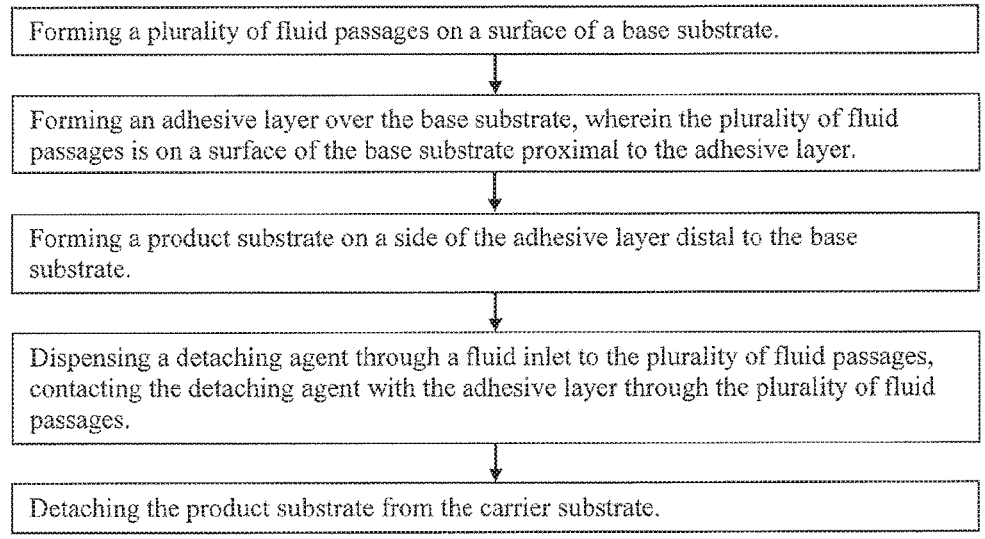
FIG. 2A is a flow chart illustrate a method of detaching an array substrate from a carrier substrate in some embodiments.

FIG. 2A is a flow chart illustrate a method of detaching an array substrate from a carrier substrate in some embodiments. Referring to FIG. 2A, the method in the embodiment include forming a plurality of fluid passages on a surface of a base substrate, forming an adhesive layer over the base substrate, wherein the plurality of fluid passages is on a surface of the base substrate proximal to the adhesive layer, forming a product substrate on a side of the adhesive layer distal to the base substrate, dispensing a detaching agent through a fluid inlet to the plurality of fluid passages, contacting the detaching agent with the adhesive layer through the plurality of fluid passages, and detaching the product substrate from the carrier substrate. As discussed above, examples of fluid passages include tubes and channels.

In some embodiments, the tube has a wall that allows a fluid to pass through. Optionally, the tube has a wall that is permeable to a fluid. Optionally, the wall of the tube is porous. For instance, when the detaching agent is dispensed into the tube, the detaching agent can flow through the wall to be in contact with the adhesive layer. Optionally, the tube is a nanotube having porous walls. For example, a carbon nanotube has a porous wall having a graphene-like structure. Optionally, the tube is made of a heat conductive material. When a product substrate is adhered to a carrier substrate having heat conductive tubes on its surface, heat may be dissipated over the product substrate more homogeneously, avoiding deformation in the product substrate (e.g., an ultrathin glass substrate) due to overheating.

Figure 2B:
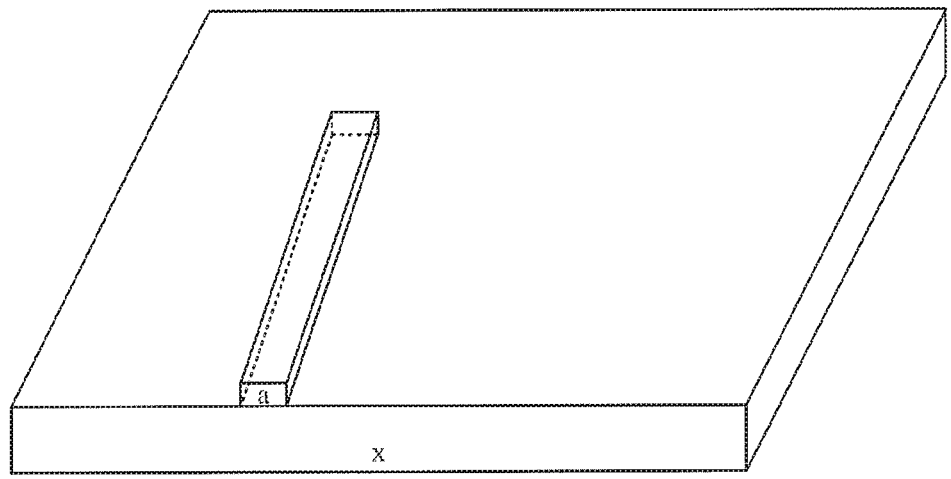
FIG. 2B is a diagram illustrating the structure of a tube formed on the surface of a base substrate in some embodiments.
Figure 2C:
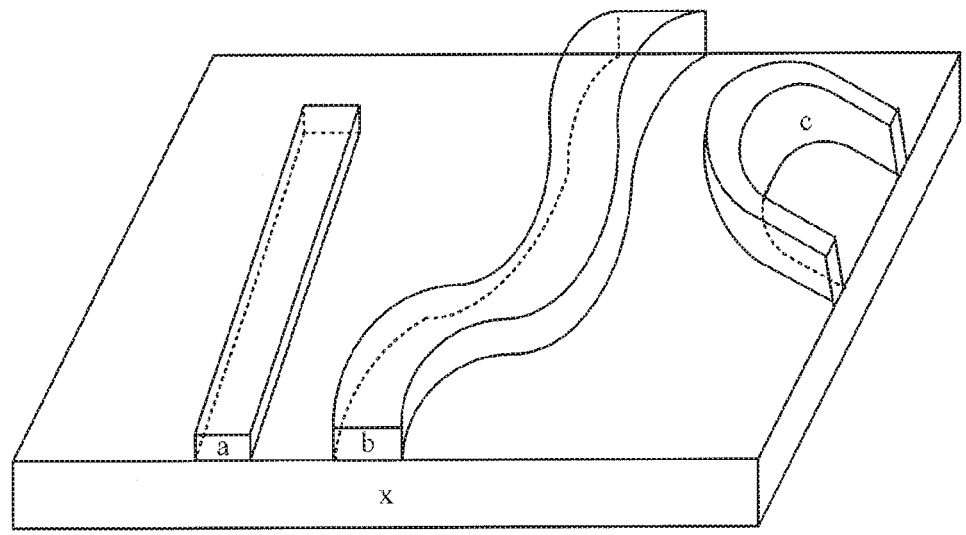
FIG. 2C is a diagram illustrating the structure of a plurality of tubes formed on the surface of a base substrate in some embodiments.
Figure 2D:
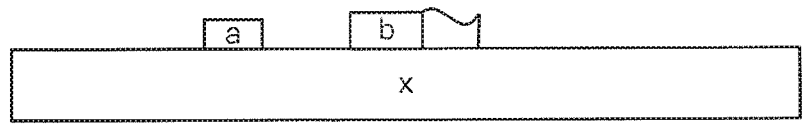
FIG. 2D is a cross-sectional view of the plurality of tubes as shown in FIG. 2C.

FIG. 2B is a diagram illustrating the structure of a tube a formed on the surface of a base substrate x in some embodiments. Referring to FIG. 2B, the base substrate x has one tube a formed on its surface. FIG. 2C is a diagram illustrating the structure of a plurality of tubes formed on the surface of a base substrate x in some embodiments. Referring to FIG. 2C, the base substrate x has three tubes a, b, and c formed on its surface. FIG. 2D is a cross-sectional view of the plurality of tubes as shown in FIG. 2C.

Figure 2E:
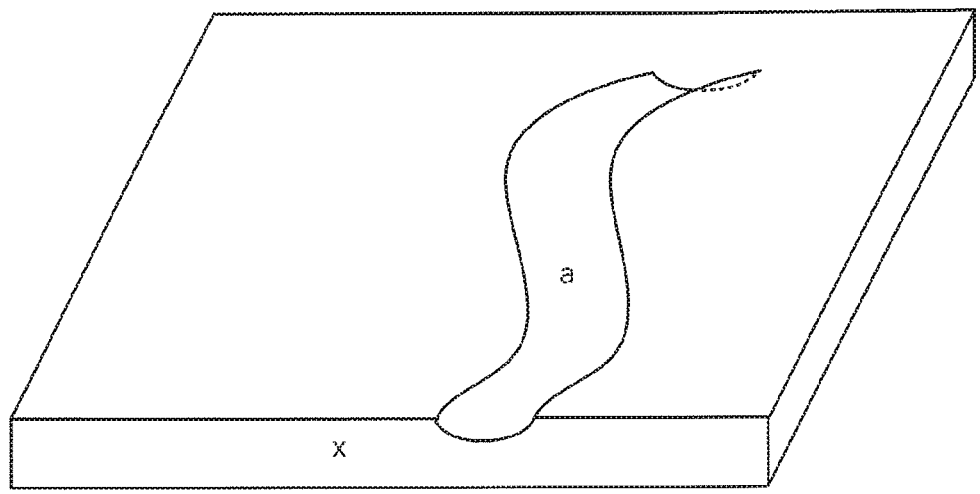
FIG. 2E is a diagram illustrating the structure of a channel formed on the surface of a base substrate in some embodiments.
Figure 2F:
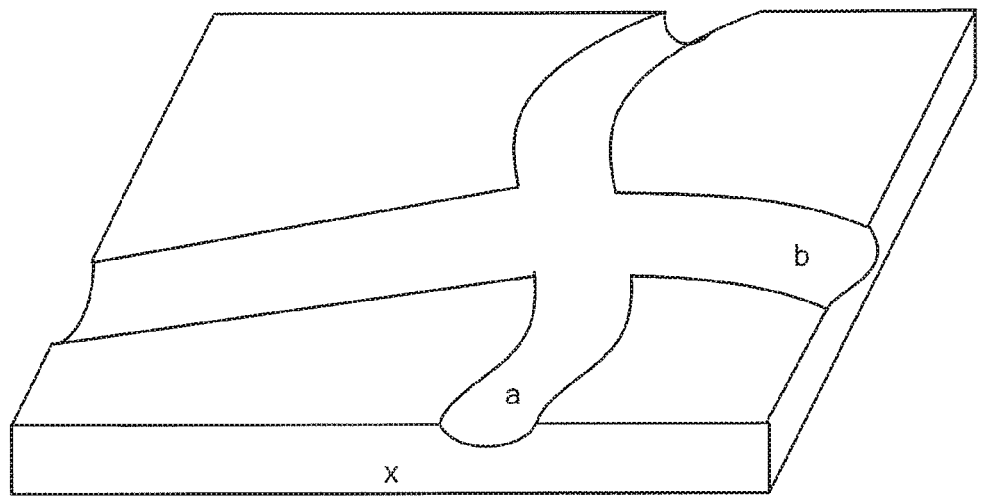
FIG. 2F is a diagram illustrating the structure of a plurality of channels formed on the surface of a base substrate in some embodiments.
Figure 2G:
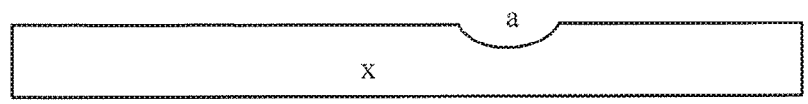
FIG. 2G is a cross-sectional view of the plurality of channels as shown in FIG. 2F.

FIG. 2E is a diagram illustrating the structure of a channel a formed on the surface of a base substrate x in some embodiments. Referring to FIG. 2E, the base substrate x has one channel a formed on its surface. FIG. 2F is a diagram illustrating the structure of a plurality of channels formed on the surface of a base substrate x in some embodiments. Referring to FIG. 2F, the base substrate x has two channels a and b formed on its surface. FIG. 2G is a cross-sectional view of the plurality of channels as shown in FIG. 2F.

Figure 2H:
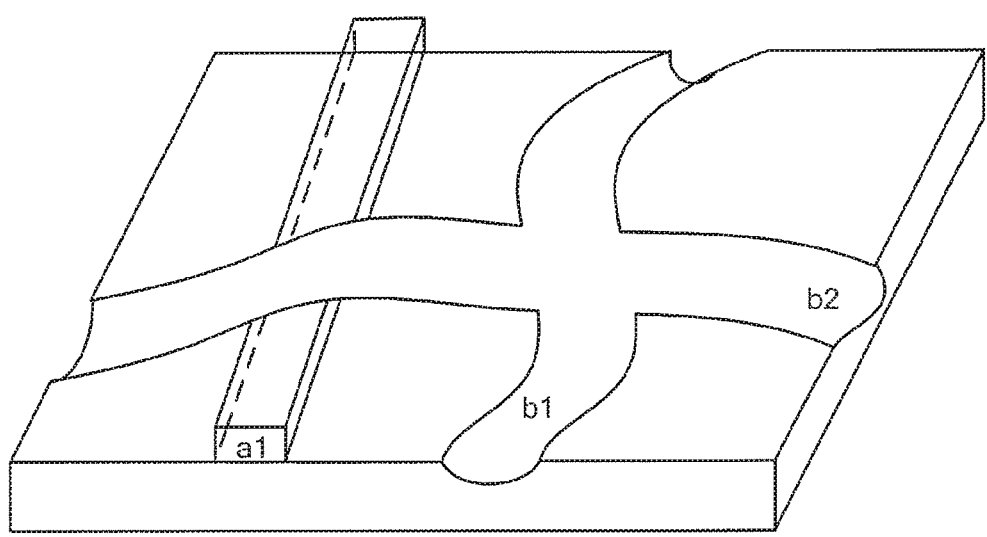
FIG. 2H is a diagram illustrating the structure of a plurality of tubes and a plurality of channels formed on the surface of a base substrate in some embodiments.
Figure 2I:
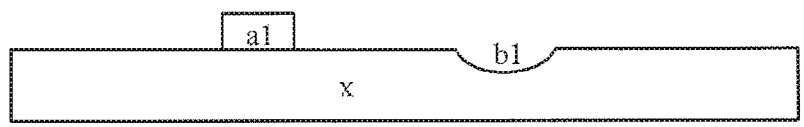
FIG. 2I is a cross-sectional view of the tube and channel as shown in FIG. 2H.

FIG. 2H is a diagram illustrating the structure of a plurality of tubes and a plurality of channels formed on the surface of a base substrate in some embodiments. Referring to FIG. 2H, the base substrate x has one tube a1 and two channels b1 and b2 formed on its surface. Optionally, the tube a1 is first formed on the surface of the base substrate x. Subsequently, two channels b1 and b2 are formed on the surface of the base substrate x. The channel b2 intersects with the tube a1, dissecting the tube a1 into two portions. The tube a1 is connected to the channel b2. FIG. 2I is a cross-sectional view of the tube and channel as shown in FIG. 2H.

Figure 2J:
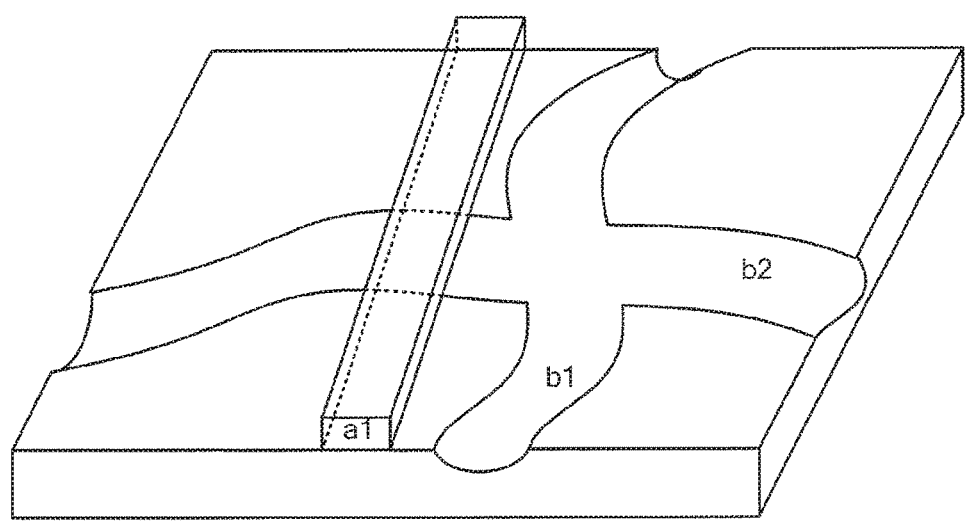
FIG. 2J is a diagram illustrating the structure of a plurality of tubes and a plurality of channels formed on the surface of a base substrate in some embodiments.
Figure 2K:
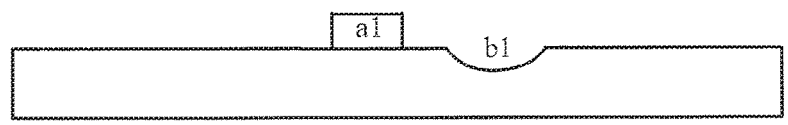
FIG. 2K is a cross-sectional view of the plurality of tubes and channels as shown in FIG. 2J.

FIG. 2J is a diagram illustrating the structure of a plurality of tubes and a plurality of channels formed on the surface of a base substrate in some embodiments. Referring the FIG. 2J, the base substrate has one tube a1 and two channels b1 and b2 formed on its surface. Optionally, the two channels b1 and b2 are first formed on the surface of the base substrate. Subsequently, the tube a1 is formed on the surface of the base substrate x. The tube a1 is connected to the channel b2. FIG. 2K is a cross-sectional view of the plurality of tubes and channels as shown in FIG. 2J.

Figure 2L:
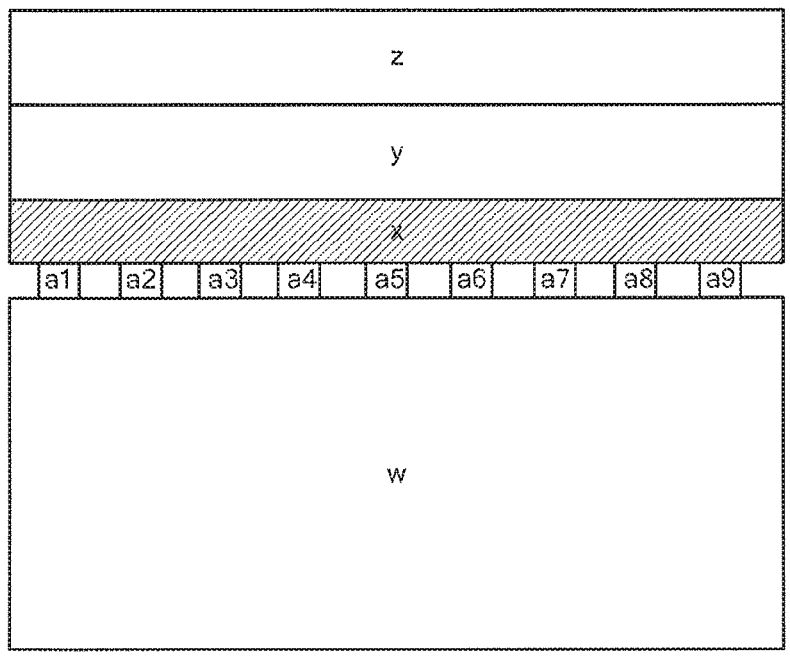
FIG. 2L is a diagram illustrating the structure of a display apparatus having an array substrate, display components, and an encapsulating substrate in some embodiments.

FIG. 2L is a diagram illustrating the structure of a display apparatus having an array substrate y, display components, and an encapsulating substrate z in some embodiments. Referring to FIG. 2L, the display apparatus in the embodiment has a base substrate w, an adhesive layer x, an array substrate y, and an encapsulating substrate z. The base substrate w in the embodiment has 9 tubes formed on its surface, a1-a9.

Figure 2M:
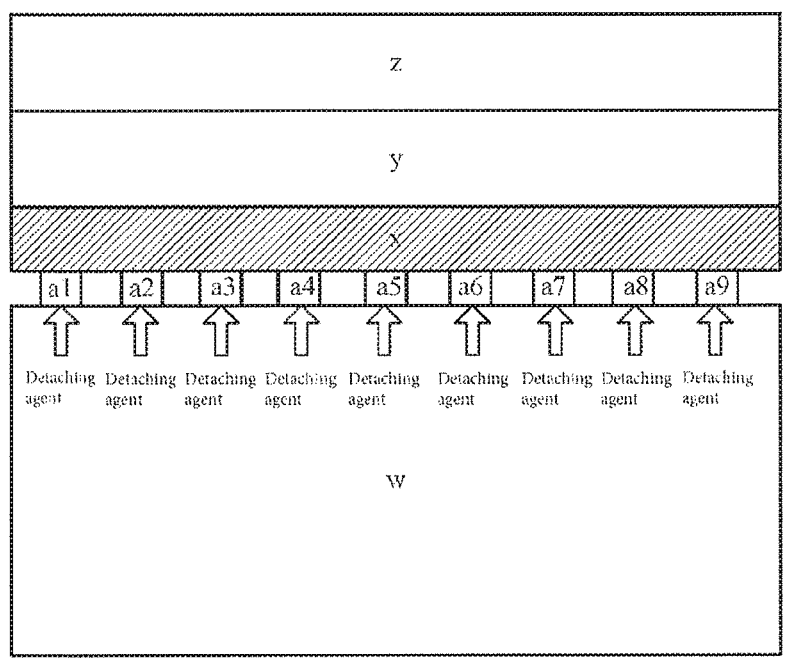
FIG. 2M is a diagram illustrating the process of dispensing a detaching agent through an orifice to a plurality of tubes in some embodiments.

FIG. 2M is a diagram illustrating the process of dispensing a detaching agent through an orifice to a plurality of tubes in some embodiments. Referring to FIG. 2M, the display apparatus in the embodiment has a base substrate w, an adhesive layer x, an array substrate y, and an encapsulating substrate z. The base substrate w in the embodiment has 9 tubes formed on its surface, a1-a9. The detaching agent is dispensed through nine orifices of the tubes into the tubes a1-a9, respectively.

In some embodiments, the tubes a1-a9 have walls that allow a fluid (e.g., a detaching agent) to pass through. The adhesive layer is contacted with the detaching agent passing through the walls of the tubes a1-a9. Optionally, after the detaching agent reacts with the adhesive layer x, the product substrate y (along with the encapsulating substrate z and display components encapsulated therein) is detached from the base substrate w.

In some embodiments, the base substrate includes at least one tube and at least one channel on its surface. Optionally, one of the at least one tube is connected with one or more channel. Optionally, one of the at least one channel is connected with one or more tube. The detaching agent can flow between the connected tube/channel. For instance, the detaching agent can flow between the tube a1 and the channel b2 in FIGS. 2H and 2J.

Various embodiments may be practiced to dispense the detaching agent into the plurality of fluid passages. In some embodiments, the detaching agent is dispensed into the plurality of fluid passages through an orifice of a tube. Referring to FIG. 2H, the detaching agent may be dispensed into the orifice of the tube a1, and flow into the channel b2 which is connected to the tube a1. Because the channel b1 is connected to the channel b2, the detaching agent can be dispensed into the channel b1. Referring to FIG. 2J, the detaching agent may be dispensed into the orifice of the tube a1 which is connected to the channel b2. The wall of the tube a1 allows the detaching agent pass through it and flow into the channel b2. For instance, the wall of the tube a1 may be permeable or porous. Because the channel b1 is connected to the channel b2, the detaching agent can also be dispensed into the channel b1.

In some embodiments, the detaching agent is dispensed into the plurality of fluid passages through an orifice of a channel. Referring to FIG. 2H, the detaching agent may be dispensed into the orifice of the channel b2, and flow into the tube a1 which is connected to the channel b2. Because the channel b1 is connected to the channel b2, the detaching agent can also be dispensed into the channel b1. Referring to FIG. 2J, the detaching agent may be dispensed into the orifice of the channel b2 which is connected to the tube a1. The wall of the tube a1 allows the detaching agent flow from the channel b2 into the tube a1. For instance, the wall of the tube a1 may be permeable or porous. Because the channel b1 is connected to the channel b2, the detaching agent can also be dispensed into the channel b1.

The tubes and channels may be made of any appropriate shapes and/or dimensions. For example, the tube and/or the channel may be straight or curved. Optionally, the tube and/or the channel includes a straight portion and a curved portion. Referring to FIG. 2C, the tube a is straight, the tube b is curved, and the tube c include both a straight portion and a curved portion. Referring to FIG. 2F, the channel a is curved, and the tube b include both a straight portion and a curved portion.

The tubes and channels may be made of any appropriate materials. In some embodiments, the tube is a nanotube. Optionally, the tube is a carbon nanotube. Optionally, the tube is a zinc oxide nanotube. Optionally, the zinc oxide nanotube is used for dispensing a gas state detaching agent.

Optionally, the carbon nanotube has a diameter in the range of about 1 nm to about 50 nm, e.g., about 1 nm to about 10 nm, about 1 nm to about 20 nm, or about 1 nm to about 30 nm. Optionally, the zinc oxide nanotube has a diameter in the range of about 100 nm to about 500 nm, e.g., about 100 nm to about 200 nm, about 100 nm to about 300 nm, or about 100 nm to about 400 nm.

Optionally, the tube has an inlet and an outlet. Optionally, the channel has an inlet and an outlet. Optionally, a network of tubes has an inlet and an outlet. Optionally, a network of channel has an inlet and an outlet. Optionally, the inlet is an orifice of a tube or a channel. Optionally, the outlet is an orifice of a tube or a channel. Optionally, the inlet and outlet are on the surface of the base substrate. Optionally, the inlet and the outlet connect an edge of the base substrate to a same or a different edge of the base substrate. Referring to FIG. 2E, the channel a is not a through-channel, which only has an inlet but not an outlet. Referring to FIG. 2F, the channels a and b are both through-channels having an inlet and an outlet. Referring to FIG. 2B, the tube a is not a through-tube, which only has an inlet but not an outlet. Referring to FIG. 2C, the tube a is not a through-tube, the tube b is a through-tube having an inlet and an outlet on two different edges of the base substrate, and the tube c is a through-tube having an inlet and an outlet on a same edge of the base substrate.

Optionally, the tunnel has a width of no more than 3 µm, e.g., in the range of about 1 nm to about 3 µm, about 1 nm to about 2 µm, about 1 nm to about 1 µm, about 0.1 µm to about 3 µm, about 0.1 µm to about 2 µm, about 0.1 µm to about 1 µm, about 1 µm to about 3 µm, about 1 µm to about 2 µm, or about 2 µm to about 3 µm. Optionally, the tunnel has a depth in the range of about 50 nm to about 500 µm, e.g., about 50 nm to about 150 µm, about 50 nm to about 250 µm, about 50 nm to about 350 µm, about 50 nm to about 450 nm, about 100 nm to about 200 µm, about 100 nm to about 300 µm, about 100 nm to about 400 µm, about 100 nm to about 500 nm, about 200 nm to about 300 µm, about 200 nm to about 400 µm, about 200 nm to about 500 µm, or about 300 nm to about 500 nm.

Optionally, the tunnel has a width of no more than 3 µm and a depth in the range of about 50 nm to about 500 nm, to maintain a certain adhesion strength between the base substrate and the adhesion layer.

In some embodiments, the base substrate includes at least two channels on its surface. Optionally, one of the at least one channel is connected with one or more channel. Referring to FIG. 2F, the channel a is connected to the channel b. Referring to FIG. 2H, the channel b1 is connected to the channel b2. Referring to FIG. 2J, the channel b1 is connected to the channel b2.

Figure 2N:
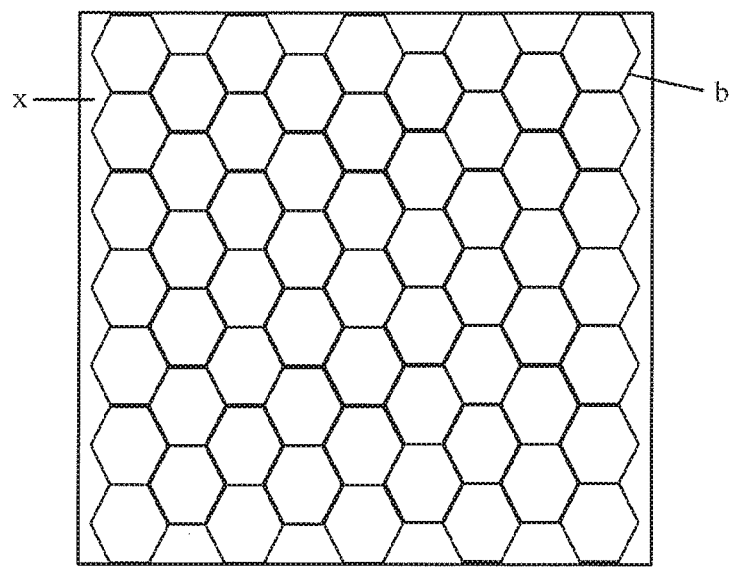
FIG. 2N is a diagram illustrating the structure of a plurality of channels having a hexagonal lattice of walls defining a network of channels.

FIG. 2N is a diagram illustrating the structure of a plurality of channels having a hexagonal lattice of walls defining a network of channels. Referring to FIG. 2N, the base substrate x has a hexagonal lattice of walls defining a network of channels b.

Figure 2O:
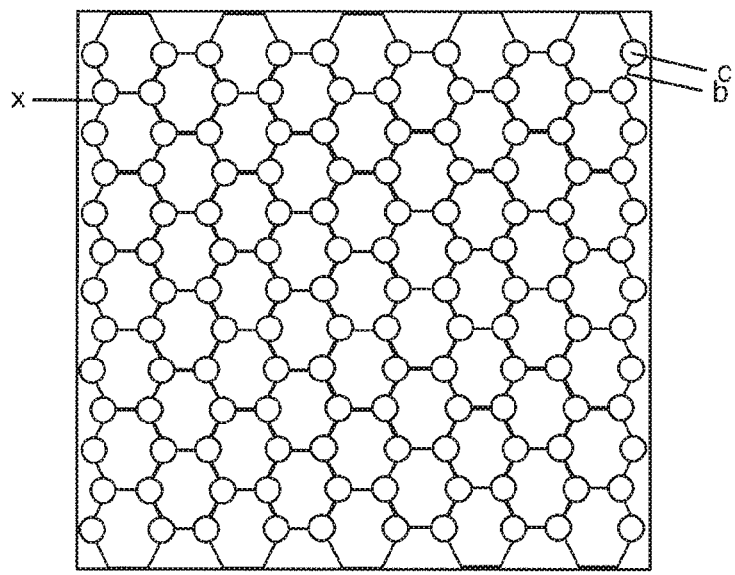
FIG. 2O is a diagram illustrating the structure of a plurality of tubes having a hexagonal lattice of walls defining a network of tubes and a plurality of circular flow channels at the intersection of lattice walls.

FIG. 2O is a diagram illustrating the structure of a plurality of channels having a hexagonal lattice of walls defining a network of channels and a plurality of circular flow channels at the intersection of lattice walls. Referring to FIG. 2O, the base substrate x has a hexagonal lattice of walls defining a network of channels b and a plurality of circular flow channels c at the intersection of lattice walls.

Optionally, the detaching agent is a gas. Optionally, the detaching agent is a liquid. Optionally, the detaching agent is a fluorine-containing material. Optionally, the detaching agent is a hydrofluorine gas. Optionally, the detaching agent is a hydrofluorine solution. Optionally, the detaching agent is a mixture of hydrofluorine gas and water vapor. For example, the detaching step may be performed by dispensing a mixture of hydrofluorine gas and water vapor, or by alternately dispensing hydrofluorine gas and water vapor. The detaching step may be performed multiple times between intervals. For example, the detaching step may be performed about 10 to about 100 times, each with a duration of about 10 seconds to about 10 minutes e.g., about 1 minute).

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a display apparatus, comprising:
    providing a carrier substrate comprising a base substrate and an adhesive layer over the base substrate, wherein the base substrate comprises a plurality of fluid passages between the base substrate and the adhesive layer, and a plurality of fluid inlets connected with the plurality of fluid passages;
    forming a product substrate on a side of the adhesive layer distal to the base substrate;
    dispensing a detaching agent through the plurality of fluid inlets to the plurality of fluid passages, and contacting the detaching agent with the adhesive layer through the plurality of fluid passages; and
    detaching the product substrate from the carrier substrate;
    wherein the plurality of fluid passages comprise a plurality of nanotubes.

2. The method of claim 1, wherein the plurality of nanotubes comprises one or a combination of a carbon nanotube and a zinc oxide nanotube.

3. The method of claim 1, further comprising forming the carrier substrate; wherein the step of forming the carrier substrate comprises:
    providing the base substrate; and
    forming the adhesive layer over the base substrate.

4. The method of claim 1, further comprising forming the carrier substrate; wherein the step of forming the carrier substrate comprises:
    forming the plurality of fluid passages on a surface of the base substrate.

5. The method of claim 1, wherein the plurality of fluid inlets are orifices of the plurality of fluid passages.

6. The method of claim 1, wherein one of the plurality of fluid passages is connected with another one of the plurality of fluid passages.

7. The method of claim 6, wherein the one of the plurality of fluid passages is a tube, and the another one of the plurality of fluid passages is a channel.

8. The method of claim 6, wherein any one of the plurality of fluid passages is connected with at least another one fluid passage.

9. The method of claim 1, wherein the plurality of fluid passages comprise a plurality of tubes.

10. The method of claim 1, wherein the plurality of nanotubes are a plurality of carbon nanotubes, and a diameter of the plurality of nanotubes is in a range of about 1 nm to about 50 nm.

11. The method of claim 1, wherein the plurality of nanotubes are a plurality of zinc oxide nanotubes, and a diameter of the plurality of nanotubes is in a range of about 100 nm to about 500 nm.

12. The method of claim 1, wherein the plurality of fluid passages comprise a plurality of channels, a width of the plurality of channels is no more than about 3 μm, and a depth of the plurality of channels is in a range of about 50 nm to about 500 nm.

13. The method of claim 1, wherein the plurality of fluid passages comprise a plurality of interconnected tubes and channels, at least one tube connects with at least one channel.

14. The method of claim 1, wherein the carrier substrate further comprises a plurality of flow outlets connected with the plurality of fluid inlets through the plurality of fluid passages, and the plurality of flow outlets are orifices of the plurality of fluid passages.

15. The method of claim 1, wherein the plurality of fluid passages comprise a lattice of walls defining a network of flow channels or tubes.

16. The method of claim 15, wherein the lattice is a hexagonal lattice, and the network comprises a circular flow channel or tube at each intersection of lattice walls.

17. A carrier substrate comprising a base substrate having a plurality of fluid passages on a surface of the base substrate and a plurality of fluid inlets connected with the plurality of fluid passages;
wherein the plurality of fluid passages comprise a plurality of nanotubes.

18. The carrier substrate of claim 17, further comprising an adhesive layer, the plurality of fluid passages on a surface of the base substrate proximal to the adhesive layer.

19. The carrier substrate of claim 17, wherein the plurality of fluid passages comprise a lattice of walls defining a network of flow channels or tubes.

20. The carrier substrate of claim 19, wherein the lattice is a hexagonal lattice, and the network comprises a circular flow channel or tube at each intersection of lattice walls.

* * * * *